(12) United States Patent
Raghava et al.

(10) Patent No.: US 6,563,386 B1
(45) Date of Patent: May 13, 2003

(54) SELF-STARTER FOR PLL SYNTHESIZERS

(75) Inventors: Madhu Raghava, Bangalore (IN);
Krishnan Santhana Rengarajan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 31 days.

(21) Appl. No.: 10/005,128

(22) Filed: Dec. 7, 2001

(51) Int. Cl.⁷ .............................. H03L 7/00; H03L 7/06
(52) U.S. Cl. ...................... 331/1 A; 331/173; 327/142; 327/156; 327/159
(58) Field of Search ........................... 331/1 A, 18, 25, 331/173; 327/142, 156–159

(56) References Cited

U.S. PATENT DOCUMENTS 5,260,979 A * 11/1993 Parker et al. ................ 375/366

* cited by examiner

*Primary Examiner*—David C. Mis
(74) *Attorney, Agent, or Firm*—Rose Alyssa Keagy; W. James Brady, III; Frederick J. Telecky, Jr.

(57) ABSTRACT

Resuming the operation of a phase locked loop (PLL) that has entered a hang up status. The output of the PLL is examined to determine whether the output is stuck at either high or low logical value. The PLL is initialized if the output is stuck. Once initialized, the PLL may resume generating a desired output clock signal.

19 Claims, 3 Drawing Sheets

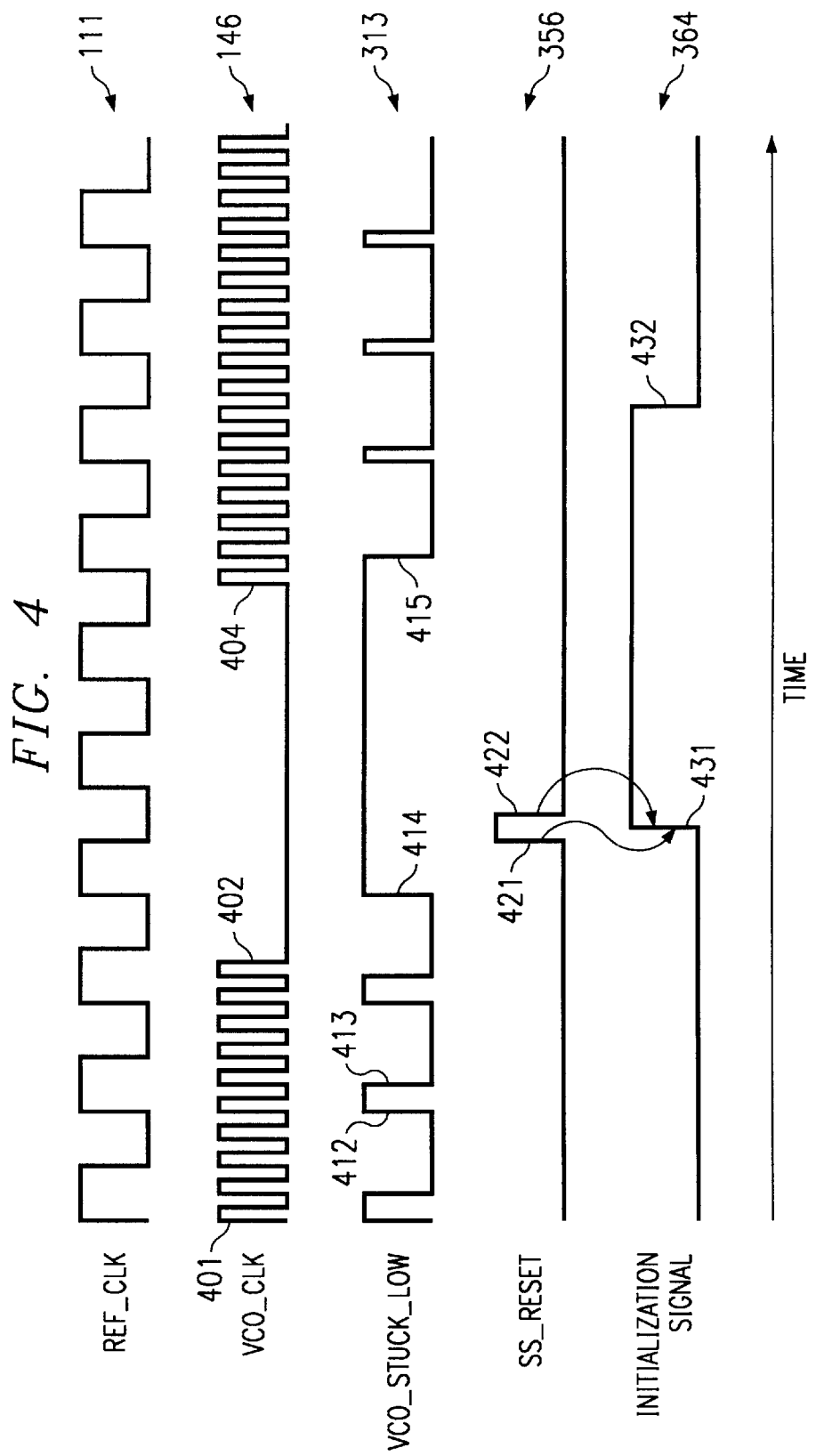

SELF-STARTER FOR PLL SYNTHESIZERS

BACKGROUND OF THE INVENTION

1. Field of the Invention

The present invention relates to phase locked loop synthesizer (PLL) circuits, and more specifically to a method and apparatus for resuming the operation of a PLL that has entered a hang up status.

2. Related Art

Phase locked loop synthesizer (PLL) circuits are often used to generate output signals synchronous with an input reference signal. Ideally, the output signal has a frequency equaling a desired multiple of the input reference signal. In addition, the output signal is ideally in phase with the input reference signal. The signals generated by PLLs are used to drive various external circuits as is well known in the relevant arts.

In some situations, PLL circuits enter a hang up status. For example, a PLL circuit may enter a hang up status either during startup or during later operation due to variations and/or imperfections in supply voltage (often referred to as Vdd) as is well known in the relevant arts. PLL circuits generally do not generate the desired output signals when in hang up status. Typically, the output generated by the PLL circuit in hang up status is at a 'stuck' condition, i.e., the output remains at a substantially constant voltage level (e.g., representing a logical 1 or 0).

Hang up status (of a PLL) is often undesirable at least in that any external circuits driven by the PLL can become non-operational. Therefore, what is needed is a method and apparatus to resume the operation of a PLL that has entered a hang up status.

BRIEF DESCRIPTION OF THE DRAWINGS

The present invention will be described with reference to the accompanying drawings, wherein:

FIG. 4 is a timing diagram of various signals illustrating the details of operation of an embodiment of initialization block.

DETAILED DESCRIPTION OF THE PREFERRED EMBODIMENTS

1. Overview and Discussion of the Invention

The present invention causes a PLL to resume operation if it (PLL) enters a hang up status. The feature is achieved by initializing the PLL if the output generated by the PLL is determined to be in a stuck condition. After initialization, the PLL may continue to generate the desired output signal.

Several aspects of the invention are described below with reference to example environments for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Environment

Figure 1:
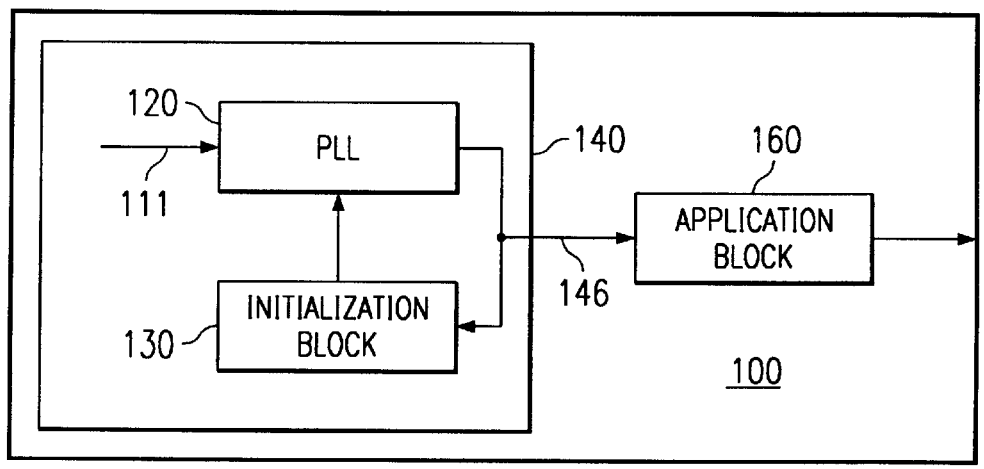
FIG. 1 is a block diagram illustrating an example environment in which the present invention can be implemented.

FIG. 1 is a block diagram illustrating an example environment in which the present invention can be implemented. There is shown system 100 containing signal generation circuit 140 and application block 160. Each component is described in further detail below.

Broadly, signal generation circuit 140 generates signals (vco_clk 146) used to drive application block 160. The signals generated by signal generation circuit 140 may also be used to drive other application blocks (not shown in FIG. 1). Application block 140 may refer to any component which uses signals generated on 146 for operation.

Continuing with reference to signal generation circuit 140, signal generation circuit 140 is shown containing PLL 120 and initialization block 130. PLL 120 generates desired output signals (vco-Clk 146) synchronous with the input signal (ref_clk 111), and may be implemented in a known way.

PLL 120 may enter into a hang up status for any reason, some of which are well known in the relevant arts. Initialization block 130 initializes (e.g., restart, reset, power on, etc.) to cause PLL 120 to resume operation. Example embodiments of initialization block 130 are described below.

3. Method

Figure 2:
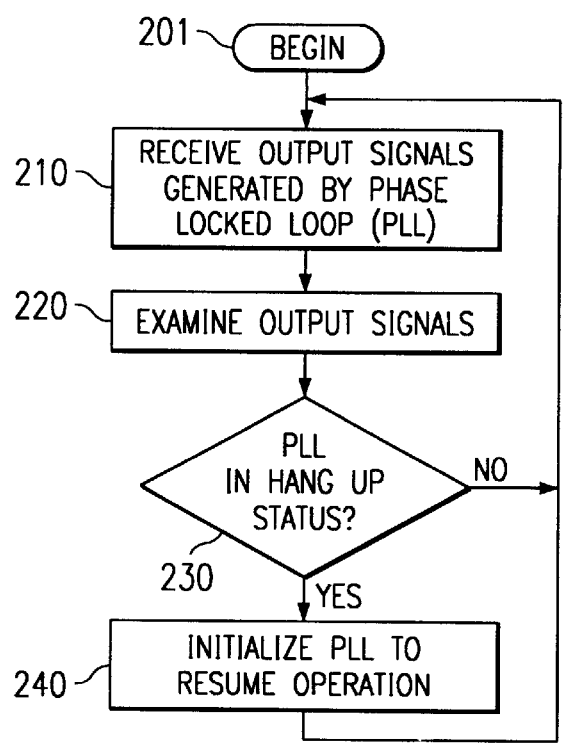
FIG. 2 is a flow chart illustrating a method to initialize a PLL according to an aspect of the present invention.

FIG. 2 is a flow-chart illustrating a method using which the operation of a PLL in a hang up status can be resumed. The method is described with reference to FIG. 1 for illustration. The method can be implemented in other environments as well. The method begins in step 201, in which control immediately passes to step 210.

In step 210, initialization block 130 receives signals generated by PLL 120. In step 220, initialization block 130 examines the received signals to determine if PLL 120 has entered a hang up status. In general, if the voltage level on the received signals is substantially unchanged over at least a pre-determined duration, initialization block 130 may determine that PLL 120 has entered hang up status.

In step 230, a decision is made according to the determination made in step 220. If the signals received by initialization block 130 are in a hang up status, then controls passes to step 240. If the signals are not in a hang up status, control passes to step 210. The loop of status 210, 220 and 230 may be viewed as continuing until a hang up status is detected.

In step 240, initialization block initializes PLL 120 to enable resumption of (accurate) operation of PLL 120. Any of several approaches can be used to initialize PLL 120. In general, the initialization approach needs to be compatible with the implementation of PLL 120. An example approach is described in the below sections. Once initialization is complete, control returns to step 210.

It should be understood that the steps described above can be implemented using many combinations of combinational and sequential logic elements as will be apparent to one skilled in the relevant arts by reading the disclosure provided herein. All such implementations are contemplated to be within the scope and spirit of the present invention. The description is continued with reference to an example embodiment of initialization block 130.

4. Initialization Block

Figure 3:
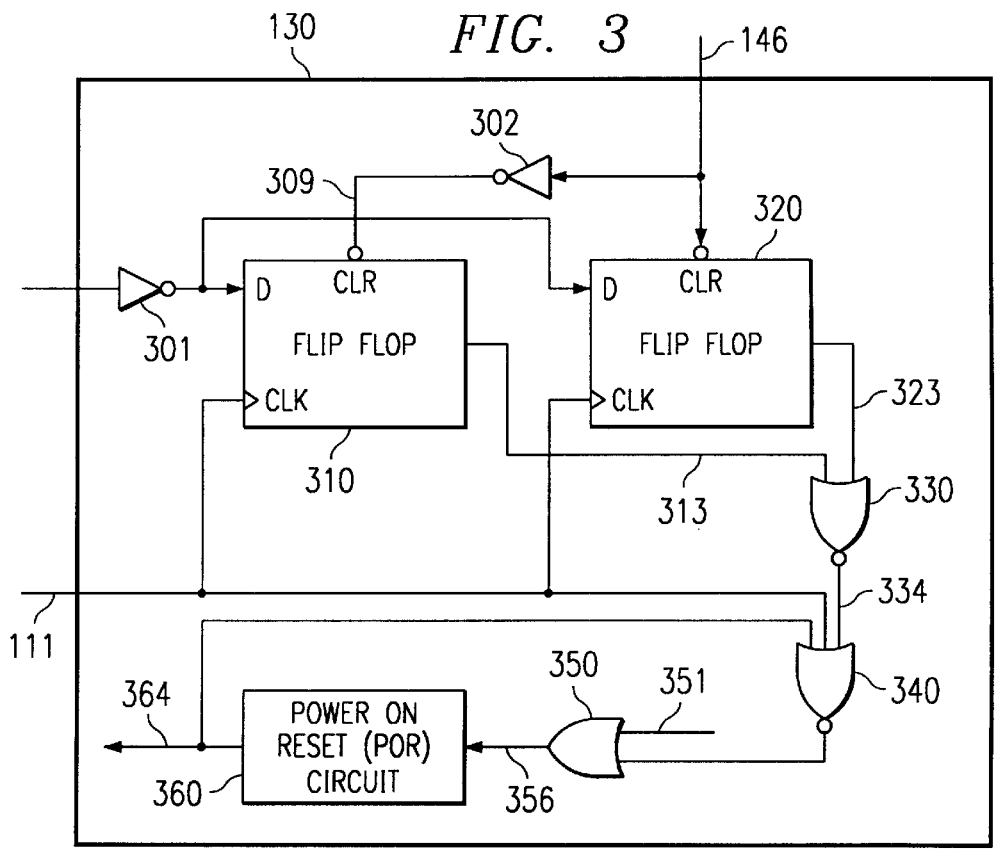
FIG. 3 is a block diagram illustrating the details of an embodiment of initialization block implemented in accordance with the present invention.

FIG. 3 is a block diagram illustrating the details of an embodiment of initialization block 130 implemented in accordance with an aspect of the present invention. Initialization block 130 is shown containing invertors 301 and 302, flip flops 310 and 320, NOR gates 330 and 340, OR gate 350 and power on reset (POR) circuit 360. Each component is described in further detail below.

Invertor 301 receives an enable signal, which is set to 0 when the initialization feature(s) provided in accordance with the present invention is to be enabled. Thus, the output of invertor 301 is set to 1 when initialization feature is to be provided, and to 0 otherwise. The description is continued assuming that the feature is enabled. Invertor 302 inverts vco_clk 146 to generate inverted_vco_clk 309.

Flip flop 310 generates vco_stuck_low signal 313 which indicates whether the PLL output (vco_clk 146) is stuck at low value (0). Flip-flop 310 is shown receiving a logical value of 1 from invertor 301 (assuming initialization feature is enabled) and is clocked by the positive edge of reference clock signal (ref_clk). Inverted vco_clk 309 clears the output of flip flop 310.

Due to the connections, when vco_clk 146 is not stuck at 0, vco_stuck_low 313 signal goes high on the positive edge of ref_clk 111, and goes low on the immediately following negative edge of inverted_vco_clk 309 (as flip-flops 310 and 320 are negative edge triggered). When vco_clk 146 is stuck at a logic low, vco_stuck_low 313 will go high on the positive edge of ref_clk but will not transition to low state because the clear input (inverted vco_clk 309) to flip-flop 310 continues at the same (low) logical level.

Similarly, flip flop 320 generates a vco_stuck_high 323 signal indicating if vco_clk 146 is stuck at high value. Flip flop 320 also receives a logical value of 1 from invertor 301 and is clocked by the positive edge of reference clock signal (ref_clk 111). Vco_clk 146 clears the output of flip flop 310.

When vco_clk 146 is not stuck at 1, vco_stuck_high signal 323 goes high on the positive edge of ref_clk 111, and goes low on the immediately following negative edge of vco_clk 146. When vco_clk 146 is stuck at a logic high, vco_stuck_high will go high on the positive edge of ref_clk but will not transition to low state because the clear input to flip-flop 310 continues at the same (high) logical level.

It may be appreciated the above-described flip-flops based approach is only an example approach for examining the output path of a PLL to determine whether the PLL has entered a hang up status. The implementation of several other circuits which perform similar operation will be apparent to one skilled in the relevant arts based on the disclosure provided herein. Such implementations are also contemplated to be within the scope and spirit of the present invention.

In general, if either vco_stuck_low 313 or vco_stuck_high signal 323 is high (which can be determined using an OR gate, not shown), PLL 120 can be initialized. However, such an approach (without additional pre-cautions) may lead to unstable implementations as will be readily appreciated by one skilled in the relevant arts. Accordingly additional pre-cautions are generally necessary before initializing PLL 120. An example approach addressing the reasons for some unstable situations is implemented using NOR gates 330 and 340, and OR gate 350 as described below.

NOR gate 330 (logically an OR gate followed by an inverter) receives both vco_stuck_low 313 and vco_stuck_high 323 signals and generates inverted_vco_stuck signal 334 having a logic low state when either the vco_stuck_low signal or the vco_stuck_high signal is at a logic high state. Otherwise, inverted_vco_stuck 334 may be at a high logical value. The low value (indicating a stuck status) on signal line 334 may be propagated to initialize PLL 120 as described below.

NOR gate 340 generates an initialization pulse soon after PLL 120 has entered a hang up status. NOR gate 340 is shown receiving three input signals—(1) inverted_vco_stuck 334, (2) ref_clk 111 and (3) initialization signal 364. The operation and relevance of the three signals is described in the below paragraph.

With respect to inverted_vco_stuck 334, the low level is translated to high level due to the operation of NOR gate 340 when other inputs permit. Ref_clk 111 causes the positive edge of initialization pulse to be delayed until the negative edge of the ref_clk 111. As vco_stuck 334 goes high only on the positive edge of ref_clk 111, stuck situations of short duration (less than half of ref_clk 111) may be ignored. Thus, short term jitters in vco_clk 146 may not trigger initialization of PLL 120.

The third input (initialization signal 364) ensures that additional initialization pulses are not generated when initialization signal 364 is asserted. As a result, unneeded initializations may be avoided, particularly at the end of an initialization pulse on ss_reset signal 356. The manner in which the initialization signal 364 may be generated is described later in this section.

OR gate 350 propagates either the initialization pulse generated by NOR gate 340 on line 356 or PWR_DN signal 351 usually generated when a user presses a power down button (not shown) provided externally. The signal generated by OR gate 350 is referred to ss_reset signal 356. In an embodiment, the clear inputs to each of the flip-flops 310 and 320 is ANDed with PWR-DN signal 351, and the resulting output is provided as an input to the clear input.

Initialization pulse may be provided to power on reset circuit 360 to generate the initialization signal. Power on reset (POR) circuit 360 generates an initialization signal on line 364 in response to initialization pulse received on ss_reset signal 356. In general, the initialization signal stays at a high level for a longer duration than the pulse. By increasing the pulse width of initialization pulse, sufficient time is provided to reset various circuits present in PLL 120. POR circuit 360 may be implemented in a known way. The description is continued with reference to the timing diagram of different clock signals generated and used by initialization block 130.

5. Timing Diagram

FIG. 4 is a timing diagram illustrating the timing relationships of some of the signals noted above. There are shown ref_clk 111, vco_clk 146, vco_stuck_low 313, ss_reset signal 356 and initialization signal 364. The relationships are described with reference to an example situation in which PLL 120 generates output signals accurately from time point 401 to time point 402, and then enters stuck-at-low status (after time point 402).

In the duration between time points 401 and 402 in which PLL 120 accurately generates the desired output clock signals, vco_stuck_low signal 313 goes high on the positive edge of ref_clk 111 as illustrated at time point 412 and goes low on the positive edge of vco_clk 146 as illustrated at time point 413. Initialization signal 356 remains at a logic low level in the entire duration since neither input to NOR gate 330 is high.

After time point 402 (until 404), it is seen that PLL 120 has entered a hang up status and is generating vco_clk 146 which is stuck at a logic low. Vco_stuck_low signal 313 goes high synchronous with the rising edge of ref_clk 111 at time point 414 and remains high until vco_clk 146 is generated accurately again. PLL 120 is shown resuming generating output signals at time point 404. Vco_stuck_low signal 313 is shown going low synchronous with the rising edge of vco_clk 146 at time point 415.

Ss_reset signal 356 is generated by OR gate 350 and goes high on the falling edge of ref_clk 111 as illustrated at time point 421. Ss_reset signal 356 going high is immediately followed by initialization signal 364 going high as illustrated at time point 431. Immediately after initialization signal 364 goes high, ss-reset signal 356 goes low as illustrated at time point 422.

It may be appreciated that the duration of self-starting reset pulse is very small (between time points 421 and 422). Initialization signal 364 generated by POR circuit 460 has a pulse width longer than the pulse width of the reset pulse (as shown between time points 431 and 432). The duration of the pulse width may be designed to a desired value as is well known in the relevant arts. The manner in which the signals described above are provided to PLL 120 is described below.

6. PLL Circuit

Figure 5:
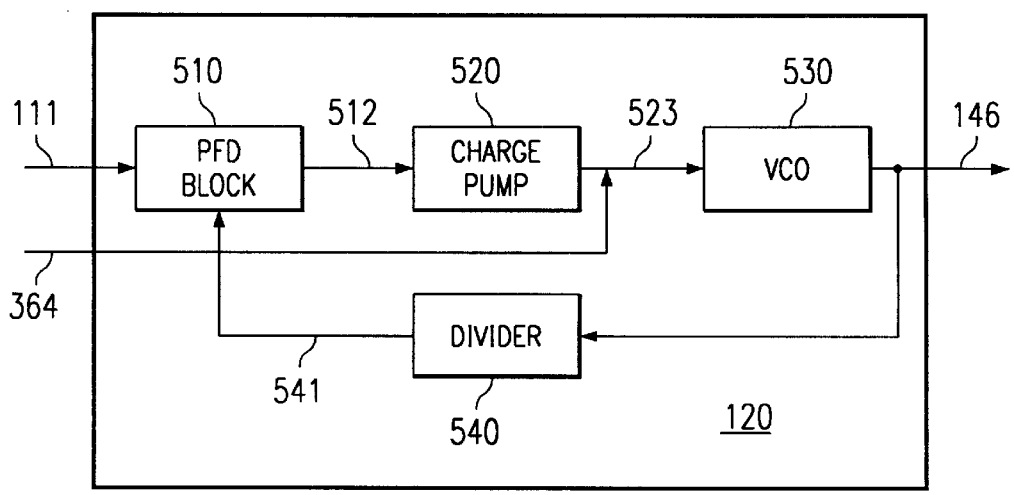
FIG. 5 is a block diagram illustrating the details of an embodiment of a PLL circuit, the operation of which is resumed after the PLL enters a hang up status.

FIG. 5 is a block diagram illustrating the details of an embodiment of PLL 120. PLL 120 is shown containing phase frequency determination (PFD) block 510, charge pump 520, voltage control oscillator (VCO) 530 and divider 540. It should be appreciated that a simple model of PLL is described merely for illustration. However, the present invention can be applied using more complex PLLs. Each component of FIG. 5 is described in further detail below.

PFD block 510 compares the phase between two inputs signals received on lines 111 and 541, and provides a voltage pulse having width generally proportionate to the extent of phase difference (between the two signals) on line 512. Charge pump 520 is charged typically proportionate to the phase difference. The charge is then used to drive the voltage inputs on line 523 to cause PLL VCO 530 to change the phase of vco_clk signal 146.

Divider 540 divides the frequency of vco_clk signal 146 to a lower frequency (corresponding to the frequency of signal 523) and generates signal 541. Signal 541 is compared with ref_clk 111 by phase frequency determination block 510 and the process may be continued as described above to generate vco_clk signal 146.

As noted above, Initialization signal 364 generated by initialization block 130 may be provided to initialize PLL 120 when in hang up status. In general, analog circuits having a feedback loop may have more than one stable state. Initialization signal 130 may be provided to ensure operation of analog circuits in the desired stable state. As shown in FIG. 5, initialization signal 364 may be provided directly to VCO 530. A high logic value on initialization signal 364 brings down the voltage on line 523 to a desirable voltage range (some operating range) such that PLL 120 can resume operation (and acquire phase) accurately after initialization.

Thus, the present invention enables a PLL to resume operation if the PLL enters a hang up status due to whatever reasons. As a result, any application blocks (systems, circuits, circuit boards, etc.) driven by the PLL may receive a clock signal without substantial interruptions.

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of generating an output clock signal synchronized with a reference clock signal, said method comprising:

providing said reference clock signal to a phase lock loop (PLL) circuit to generate said output clock signal on an output path of said PLL circuit;

examining said output path to determine whether said PLL circuit has entered a hang up status; and if said PLL circuit has entered said hang up status, initializing said PLL to cause said PLL to resume operation such that said output clock signal continues to be generated on said output path.

2. The method of claim 1, wherein said hang up status comprises a stuck condition of said output clock signal in a low state or a high state.

3. The method of claim 2, wherein said initializing is performed only if said PLL circuit remains in said hang up status for a few clock cycles of said output clock signal.

4. A circuit for generating an output clock signal synchronized with a reference clock signal, said circuit comprising:

a phase lock loop (PLL) generating said output clock signal;

means for determining whether said PLL has entered a hang up status; and means for initializing said PLL if said PLL has entered said hang up status, wherein initializing causes said PLL to resume operation such that said output clock signal continues to be generated on said output path.

5. The circuit of claim 4, wherein said hang up status comprises a stuck condition of said output clock signal in a low state or a high state.

6. The circuit of claim 5, wherein said initializing is performed only if said PLL circuit remains in said hang up status for a few clock cycles of said output clock signal.

7. An initialization circuit for causing a phase lock loop (PLL) to resume operation of said PLL has entered a hangup status, said PLL generating an output clock signal synchronized with a reference clock signal, said initialization circuit comprising:

a first flip flop and a second flip flop, both receiving a logic value on a data input, wherein said first flip-flop is cleared by an inverted output clock signal and said second flip-flop is cleared by said output clock signal, wherein each of said first flip flop and said second flip flop generates an output, wherein one of said first flip flop and said second flip flop indicates whether said output clock signal is stuck at zero and the other flop indicates whether said output clock signal is struck at one; and a logic gate performing a logic operation of said output of said first flip flop and said second flip flop, wherein one logic value on an output of said logic gate indicates whether said PLL is in said hangup status.

8. The initialization circuit of claim 7, further comprising a power on reset (POR) circuit which generates an initialization signal if said output of said logic gate indicates that said PLL is in a hang up status, wherein said initialization signal initializes said PLL.

9. The initialization circuit of claim 8, wherein said logic gate comprises an OR gate and said logic value comprises a 1.

10. The initialization circuit of claim 9, wherein said OR gate is contained in a first NOR gate.

11. The initialization circuit of claim 10, wherein both said first flip flop and said second flip flop are clocked by said reference clock signal, said initialization circuit further comprising:

a second NOR gate accepting the output of said first NOR gate and said reference clock signal as inputs, whereby said NOR gate generates an initialization pulse as an output, wherein said initialization pulse is provided as an input to said POR circuit.

12. The initialization circuit of claim 11, further comprises an OR gate receiving said output of said second NOR gate and a power down signal as inputs, wherein an output of said OR gate is provided as an input to said POR circuit.

13. A system, comprising:

a phase lock loop (PLL) generating an output clock signal synchronized with a reference clock signal, said output clock signal being generated on an output of said PLL;

an application block coupled to receive said output clock signal; and an initialization block examining said output to determine whether said PLL has entered a hang up status, said initialization block initializing said PLL if said PLL has entered said hang up status.

14. The system of claim 13, wherein said initialization circuit comprises:

a first flip flop and a second flip flop, both receiving a logic value on a data input, wherein said first flip-flop is cleared by an inverted output clock signal and said second flip-flop is cleared by said output clock signal, wherein each of said first flip flop and said second flip flop generates an output, wherein one of said first flip flop and said second flip flop indicates whether said output clock signal is stuck at zero and the other flop indicates whether said output clock signal is struck at one; and a logic gate performing a logic operation of said output of said first flip flop and said second flip flop, wherein one logic value on an output of said logic gate indicates whether said PLL is in said hangup status.

15. The system of claim 14, further comprising a power on reset (POR) circuit which generates an initialization signal if said output of said logic gate indicates that said PLL is in a hang up status, wherein said initialization signal initializes said PLL.

16. The system of claim 15, wherein said logic gate comprises an OR gate and said logic value comprises a 1.

17. The system of claim 16, wherein said OR gate is contained in a first NOR gate.

18. The system of claim 17, wherein both said first flip flop and said second flip flop are clocked by said reference clock signal, said initialization circuit further comprising:

a second NOR gate accepting the output of said first NOR gate and said reference clock signal as inputs, whereby said NOR gate generates an initialization pulse as an output, wherein said initialization pulse is provided as an input to said POR circuit.

19. The system of claim 18, further comprises an OR gate receiving said output of said second NOR gate and a power down signal as inputs, wherein an output of said OR gate is provided as an input to said POR circuit.

* * * * *